(12) United States Patent
Stansbury

(10) Patent No.: US 6,617,947 B1
(45) Date of Patent: Sep. 9, 2003

(54) TUNING CIRCUIT

(75) Inventor: James W. Stansbury, Brooklyn Park, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 10/085,492

(22) Filed: Feb. 27, 2002

(51) Int. Cl.[7] .................................................. H03J 3/20
(52) U.S. Cl. ........................................ 334/71; 333/131
(58) Field of Search .................................. 333/119, 131, 333/136; 334/61, 63, 71, 72, 74, 75; 336/20, 75, 126

(56) References Cited

U.S. PATENT DOCUMENTS 2,762,983 A * 9/1956 Graves et al. ............ 333/24 R
3,349,345 A * 10/1967 Winegard .................... 333/131
5,006,822 A * 4/1991 Reddy ......................... 333/112
6,184,755 B1 * 2/2001 Barber et al. ................ 331/181

* cited by examiner

Primary Examiner—Seungsook Ham
(74) Attorney, Agent, or Firm—Merchant & Gould P.C.

(57) ABSTRACT

A tuning circuit for a circuit board having an inductor coupling a first and a second trace, the tuning circuit including a first tuning coil having a loop partially extending over the inductor and a second tuning coil having a loop also partially extending over the inductor. The loop of the second tuning coil also partially extends over the loop of the first tuning coil. The circuit is tuned by adjusting the spacing between the loops of the first and second tuning coils and/or adjusting the spacing between the loops and the circuit board.

31 Claims, 8 Drawing Sheets

TUNING CIRCUIT

BACKGROUND OF THE INVENTION

In the telecommunications industry and more particularly in the video transmission industry signals (e.g., 5 MHz to 1 GHz) are carried over coax conductors from a headend to customers. At the headend of the systems, numerous signals are manipulated to achieve a wide variety of functions and objectives. For example, signals carried on numerous coax cables may be combined onto a single coax conductor. Similarly, a signal on a main coax conductor may be divided into a plurality of signals carried on branch coax conductors.

FIG. 1 is a top view of a portion of a circuit board having a tuning circuit according to the prior art. A circuit 10 is provided in which tuning coils are used to provide better isolation between ports of a splitter or combiner module. More particularly, the circuit 10 includes a printed circuit board 12, a splitter inductor 14, a first trace 16 and a second trace 18. The first and second trace each have a first end 20, 22 respectively and a second end 21, 23 respectively. The second ends 21, 23 of the first and second traces 16, 18 are coupled together by the splitter inductor 14. While the inductor 14 is referred to as a splitter inductor, the tuning circuit as described could be used in a combiner module. Located at the first ends 20, 22 of the first and second traces 16, 18 respectively, are a first port 25 and a second port 27. If the circuit is being used in a splitter then the first and second ports 25, 27 are output ports. If the circuit is being used in a combiner, then ports 25, 27 are input ports.

Because the first and second traces 16, 18 are physically and electrically connected through the inductor 14, providing isolation between the traces becomes important. It has been found that to provide a better level of isolation between the first and second traces 16, 18, tuning coils 24 and a resistor 29 between the coils were placed on the circuit. In particular, a first via 26 and a second via 28 are provided on the circuit board. Each tuning coil 38 has a first leg 30 and a second leg 32 (see FIG. 2). The first and second legs 30, 32 fit in the first and second vias 32, 34. The tuning coils 24 can then be soldered to the circuit board 12 by any well known method. One tuning coil 24 is placed alongside the first trace 16 and the other tuning coil 24 is placed alongside the second trace 18. Of course, since a splitter or combiner typically would have more than a first and second trace, separate tuning coils would be provided for each trace.

FIG. 2 is a perspective view of the prior art circuit shown in FIG. 1. As can be seen in FIG. 2 each tuning coil 24 has a double loop structure 38. To tune the circuit, a frequency analyzer is coupled to the first and second traces 16, 18 and, while monitoring the frequency response of that portion of the circuit, one adjusts the spacing between each loop by either pressing the loops closer together or pulling them further apart to tune that portion of the circuit.

FIG. 3 is an elevational view of a tuning coil according to the prior art. Such a tuning coil is typically made of copper and more preferably, copper wire having a gauge of 20 AWG. The tuning coil 24 when used in a combiner or splitter might have a length of 1.39 inches, a height of 0.32 inches and a thickness of 0.107 The loop 38 might have a diameter of 0.157 inches. FIG. 4 is a side view of the prior art coil shown in FIG. 3.

While the tuning circuit shown in FIGS. 1–4 provides a degree of isolation, there is always a need to provide for better isolation between traces in a simple and inexpensive way.

SUMMARY OF THE INVENTION

According to a first aspect of the invention, there is provided a circuit for providing tuning on a circuit board. The circuit includes a first trace, a second trace and an inductor. The first trace and second trace each have a first end and a second end. The inductor couples the first trace and the second trace at their respective first ends. A first tuning coil and a second tuning coil are provided. The first tuning coil has a first leg and a second leg coupled together by a loop. The first and second legs are coupled to the circuit board alongside the first trace and the loop of the first tuning coil extends partially over the inductor coupling. The second tuning coil has a first leg and a second leg coupled together by a loop. The first and second legs are coupled to the circuit board alongside the second trace and the loop of the second tuning coil extends partially over the inductor coupling.

According to a second aspect of the invention, there is provided a NX1 combiner circuit. The circuit includes N input traces, a first tuning coil and a second tuning coil. The N input traces are on a circuit board and are divided into N/2 pairs and each pair is coupled to a distinct inductor coupling. The first tuning coil has a first leg and a second leg coupled together by a loop. The first and second legs are coupled to the circuit board alongside a first trace of a pair and the loop of the first tuning coil extends partially over the inductor coupling associated with that pair. The second tuning coil has a first leg and a second leg coupled together by a loop. The first and second legs are coupled to the circuit board alongside a second trace of the pair and the loop of the second tuning coil extends partially over the inductor coupling associated with that pair.

According to a third aspect of the invention, there is provided a NX1 splitter circuit. The splitter circuit includes N output traces, a first tuning coil and second tuning coil. The N output traces are on a circuit board and are divided into N/2 pairs and each pair is coupled to a distinct inductor coupling. The first tuning coil has a first leg and a second leg coupled together by a loop. The first and second legs are coupled to the circuit board alongside a first trace of a pair and the loop of the first tuning coil extends partially over the inductor coupling associated with that pair. The second tuning coil has a first leg and a second leg coupled together by a loop. The first and second legs are coupled to the circuit board alongside a second trace of the pair and the loop of the second tuning coil extends partially over the inductor coupling associated with that pair.

According to a fourth aspect of the invention, there is provided a method of tuning a circuit having a first trace having a first end and a second end, a second trace having a first end and a second end, an inductor coupling the first trace and the second trace at their perspective first ends, a first tuning coil having a first leg and a second leg coupled together by a loop wherein the first and second leg are coupled to the circuit board alongside the first trace, and a second tuning coil having a first leg and a second leg coupled together by a loop wherein the first and second legs are coupled to the circuit board alongside the second trace, The method includes the steps of bending the loop of the first tuning coil so that the loop of the first tuning coil extends partially over the inductor coupling, bending the loop of the second tuning coil over the loop of the first tuning coil so that the loop of the second tuning coil extends partially over the inductor coupling and the loop of the first tuning coil, and adjusting the distance between the loop of the first coil and the loop of the second coil until a desired amount of isolation is achieved between the first trace and the second trace.

According to a fifth aspect of the invention, there is provided an apparatus for providing tuning on a circuit board. The apparatus includes a first tuning coil and a second tuning coil. The first tuning coil has a first leg and a second leg coupled together by a loop and the first and second legs are coupled to a circuit board alongside a first trace. The second tuning coil has a first leg and a second leg coupled together by a loop and the first and second legs are coupled to the circuit board alongside a second trace. The loop of the first tuning coil extends partially over an inductor coupling that couples the first and second trace together at one end and the loop of the second tuning coil extends partially over the inductor coupling.

According to a sixth aspect of the invention, there is provided a circuit for providing tuning on a circuit board. The circuit includes a first trace, a second trace, an inductor coupling, a first tuning coil and a second tuning coil. The first and second traces have a first end and a second end. The inductor coupling couples the first trace and the second trace at their respective first ends. The first tuning coil has a first leg and a second leg coupled together by a loop. The first and second legs are coupled to the circuit board and the loop of the first tuning coil extends partially over the inductor coupling. The second tuning coil has a first leg and a second leg coupled together by a loop. The first and second legs are coupled to the circuit board and the loop of the second tuning coil extends partially over the inductor coupling.

DETAILED DESCRIPTION OF THE PREFERRED EMBODIMENT

Figure 5:
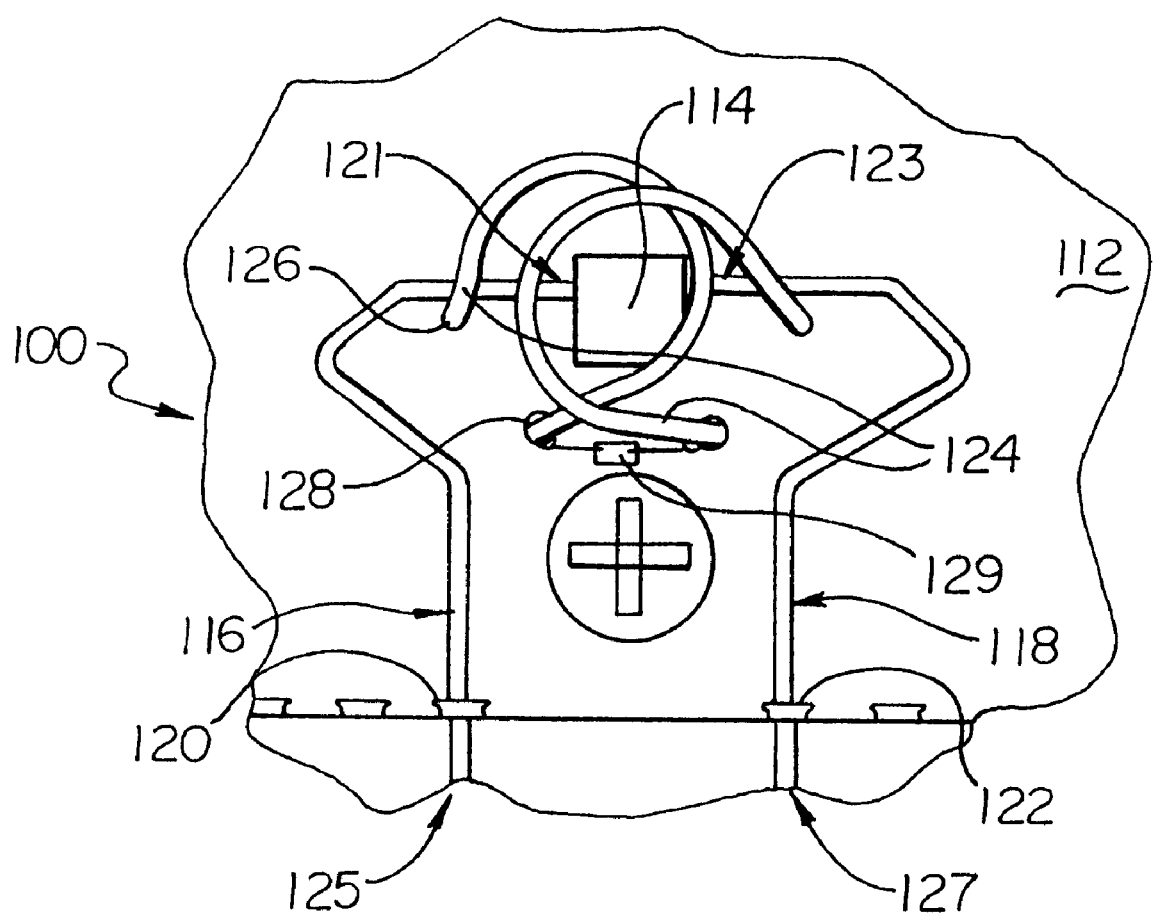
FIG. 5 is a top view of a portion of a circuit board having a tuning circuit according to a preferred embodiment of the present invention.

FIG. 5 is a top view of a portion of a circuit board having a tuning circuit according to a preferred embodiment the present invention. A circuit 100 is provided in which tuning coils are used to provide better isolation between ports of a splitter or combiner module. More particularly, the circuit 100 includes a printed circuit board 112, a splitter inductor 114, a first trace 116 and a second trace 118. The first and second trace each have a first end 120, 122 respectively and a second end 121, 123 respectively. The second ends 121, 123 of the first and second traces 116, 118 are coupled together by the splitter inductor 114. While inductor 114 is referred to as a splitter, the tuning circuit as described could be used with a combiner. Located at the first ends 120, 122 of the first and second traces 116, 118 respectively, are a first port (not shown) and a second port (not shown). If the circuit is being used in a splitter then the first and second ports 125, 127 are output ports. If the circuit is being used in a combiner, then ports 125, 127 are input ports. While only two traces are shown, it will be appreciated that if the tuning circuit according to the preferred embodiments of the present invention is used in a NX1 combiner module or a 1XN splitter module, there would be N traces divided into pairs where each pair is coupled by an inductor. The tuning circuit according to the preferred embodiments of the present invention would be used with the inductor for each pair.

To provide a better level of isolation between the first and second traces 116, 118, tuning coils 124 and resistor 129 are placed on the circuit. In particular, a first via 126 and a second via 128 are provided on the circuit board. Each tuning coil 138 has a first leg 130 and a second leg 132 (see FIG. A). The first and second legs 130, 132 fit in the first and second vias 132, 134, respectively. The tuning coils 124 can then be soldered to the circuit board 112 by any well known method. One tuning coil 124 is placed alongside the first trace 116 and the other tuning coil 124 is placed alongside the second trace 118. Of course, since a splitter or combiner typically would have more than a first and second trace, separate tuning coils would be provided for each pair of traces. In addition, the tuning coils need not be placed alongside a trace but may be positioned elsewhere on the circuit board.

Figure 6:
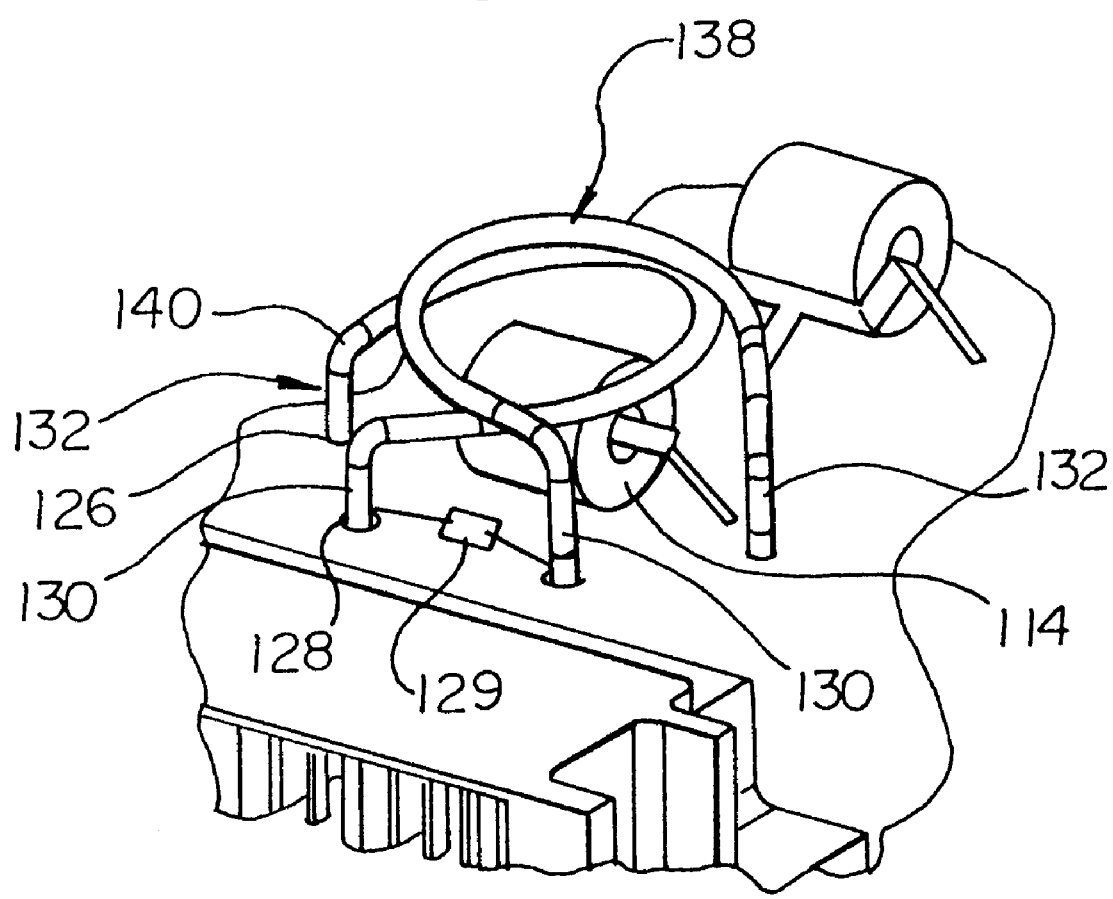
FIG. 6 is a perspective view of the circuit shown in FIG. 5.

FIG. 6 is a perspective view of the circuit shown in FIG. 5. As can be seen in FIG. 6 each tuning coil 124 has a single loop structure 138. To tune the circuit, a frequency analyzer is coupled to the first and second traces 116, 118. While monitoring the frequency response of that portion of the circuit, the loop 138 of a first of the tuning coils 124 is bent so that the loop is at least partially over the splitter inductor 144. The loop of the second of the tuning coils 124 is then bent so that it is also at least partially over the splitter inductor. In a preferred embodiment, the loop of the second tuning coil is also partially over the loop of the first tuning coil. To tune that portion of the circuit the spacing between the overlapping loops is adjusted. In addition, the spacing between the circuit board and the loops of the first and second tuning coils can be adjusted until the circuit is properly tuned. Also, a combination of adjusting the spacing between the loops and the distance of the loops from the surface of the circuit board can be made. In a preferred embodiment of the present invention, it has been found that the distance between the first tuning coil and the surface of the circuit board may range from a distance of about 0.02 to about 0.3 inches. In addition, the gap between the loop of the first tuning coil and the loop of the second tuning coil may range a distance form about 0.02 to about 0.3 inches.

Figure 7:
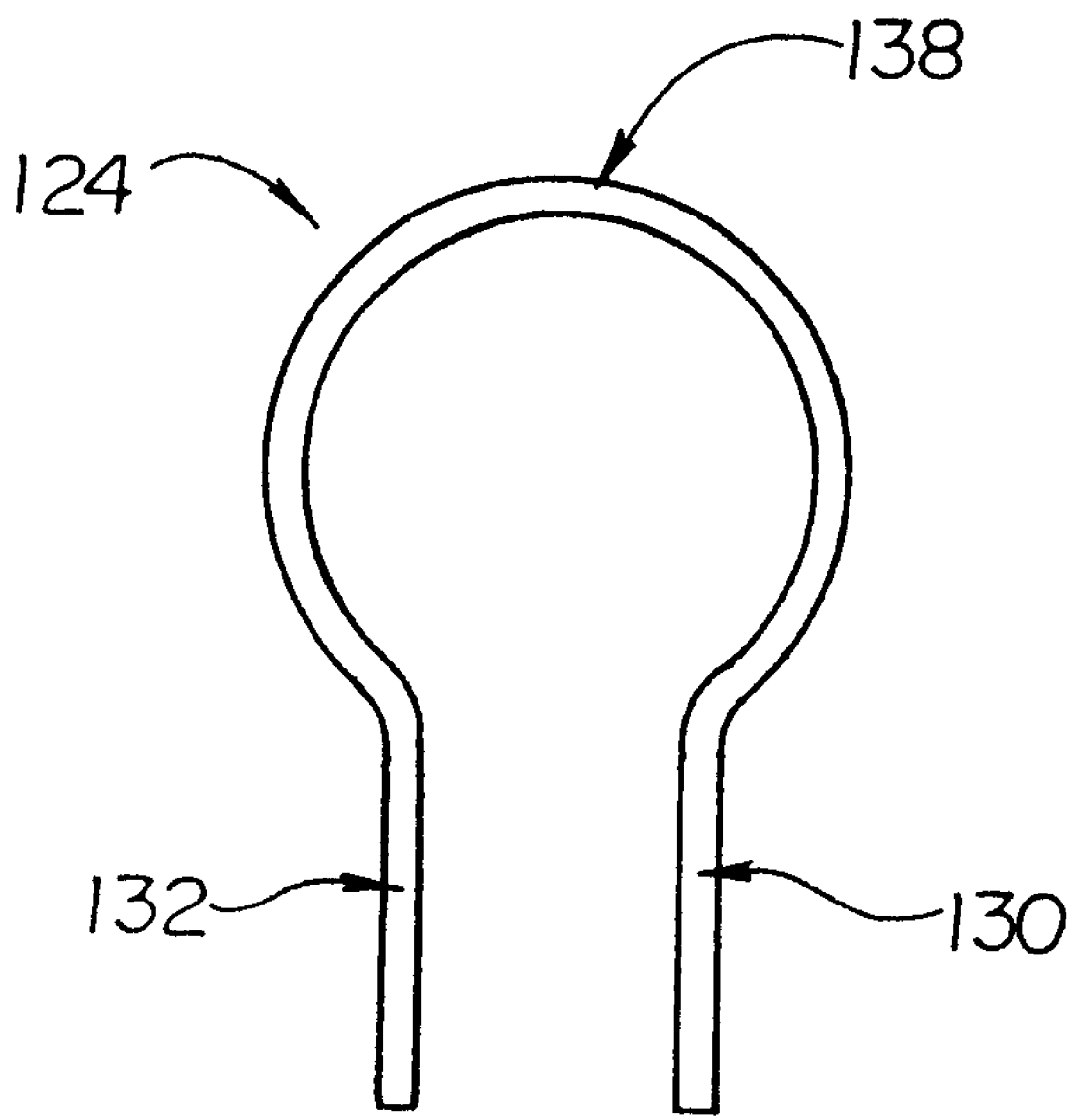
FIG. 7 is an elevational view of a tuning coil according to a preferred embodiment of the present invention.
Figure 8:
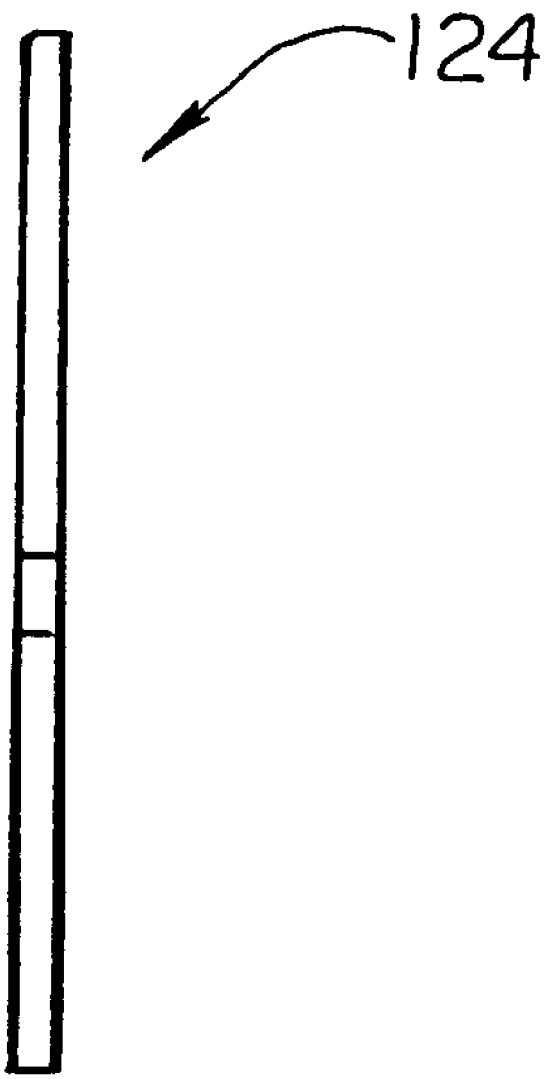
FIG. 8 is a side view of the tuning coil shown in FIG. 7.

FIG. 7 is an elevational view of a tuning coil 124 according to a preferred embodiment of the present invention. The tuning coil 124 is preferably made of copper wire having a gauge of 24 AWG so that it is flexible enough to be bent as needed. The tuning coil 124 when used in a combiner or splitter might have a length of 1.125 inches and a height of 0.4 inches above the printed circuit board. The tuning coil preferably has a total height of 0.627 inches. The loop 138 might have a diameter of 0.25 inches. FIG. 8 is a side view of the tuning coil shown in FIG. 7.

It has been found that isolation between ports of a splitter module including the tuning circuit of the preferred embodiments of the present invention increased the measured isolation by 5 decibels over the prior art previously described.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A circuit for providing tuning on a circuit board, the circuit comprising:
   a first trace having a first end and a second end;
   a second trace having a first end and a second end;
   an inductor coupling the first trace and the second trace at their respective first ends;
   a first tuning coil having a first leg and a second leg coupled together by a loop wherein the first and second legs are coupled to the circuit board alongside the first trace and wherein the loop of the first tuning coil extends partially over the inductor; and
   a second tuning coil having a first leg and a second leg coupled together by a loop wherein the first and second legs are coupled to the circuit board alongside the second trace and wherein the loop of the second tuning coil extends partially over the inductor.

2. A circuit according to claim 1 wherein the loop of the second tuning coil extends partially over the loop of the first tuning coil.

3. A circuit according to claim 2 wherein a gap separates the loop of the first tuning coil and the loop of the second tuning coil.

4. A circuit according to claim 2 wherein the loop of the first tuning coil is located a distance from the circuit board ranging from about 0.02 to about 0.30 inches.

5. A circuit according to claim 3 wherein the gap between the loop of the first tuning coil and the loop of the second tuning coil ranges from about 0.02 to about 0.30 inches.

6. A circuit according to claim 3 wherein the loop of the first tuning coil is located a distance from the circuit board ranging from about 0.02 to about 0.30 inches and the gap between the loop of the first tuning coil and the loop of the second tuning coil ranges from about 0.02 to about 0.30 inches.

7. A circuit according to claim 2 wherein the combination of the loops of the first and second tuning coils encircles the inductor.

8. A circuit according to claim 1 further comprising:
   a first port located at the second end of the first trace; and
   a second port located at the second end of the second trace.

9. A circuit according to claim 1 wherein the first and second tuning coils are made of copper wire.

10. A circuit according to claim 1 wherein he first and second tuning coils are 24 AWG gauge wire.

11. A circuit according to claim 1 wherein the loops of the first and second tuning coils have a diameter of about 0.25 inches.

12. A circuit according to claim 1 wherein the first and second tuning coils have a length of about 1.125 inches.

13. A circuit according to claim 1 wherein the first and second legs of the first and second tuning coils have a length of about 0.205 inches.

14. A NX1 combiner circuit comprising: N input traces on a circuit board wherein the N traces are divided into N/2 pairs and each pair is coupled to a distinct inductor coupling;
   a first tuning coil having a first leg and a second leg coupled together by a loop wherein the first and second legs are coupled to the circuit board alongside a first trace of a pair and wherein the loop of the first tuning coil extends partially over the inductor coupling associated with that pair; and
   a second tuning coil having a first leg and a second leg coupled together by a loop wherein the first and second legs are coupled to the circuit board alongside a second trace of the pair and wherein the loop of the second tuning coil extends partially over the inductor coupling associated with that pair.

15. A NX1 splitter circuit comprising: N output traces on a circuit board wherein the N traces are divided into N/2 pairs and each pair is coupled to a distinct inductor coupling;
   a first tuning coil having a first leg and a second leg coupled together by a loop wherein the first and second legs are coupled to the circuit board alongside a first trace of a pair and wherein the loop of the first tuning coil extends partially over the inductor coupling associated with that pair; and
   a second tuning coil having a first leg and a second leg coupled together by a loop wherein the first and second legs are coupled to the circuit board alongside a second trace of the pair and wherein the loop of the second tuning coil extends partially over the inductor coupling associated with that pair.

16. A method of tuning a circuit having a first trace having a first end and a second end, a second trace having a first end and a second end, an inductor coupling the first trace and the second trace at their perspective first ends, a first tuning coil having a first leg and a second leg coupled together by a loop wherein the first leg and second leg are coupled to the circuit board alongside the first trace, and a second tuning coil having a first leg and a second leg coupled together by a loop wherein the first and second leg are coupled to the circuit board alongside the second trace, the method comprising the steps of:
   bending the loop of the first tuning coil so that the loop of the first tuning coil extends partially over the inductor;
   bending the loop of the second tuning coil over the loop of the first tuning coil so that the loop of the second tuning coil extends partially over the inductor and the loop of the first tuning coil; and
   adjusting the distance between the loop of the first coil and the loop of the second coil until a desired amount of isolation is achieved between the first trace and the second trace.

17. A method according to claim 16 further comprising a step of adjusting the distance between the loop of the first coil and the circuit board until a desired amount of isolation is achieved between the first and second traces.

18. An apparatus for providing tuning on a circuit board, the apparatus comprising:
   a first tuning coil having a first leg and a second leg coupled together by a loop wherein the first and second legs are coupled to a circuit board alongside a first trace; and
   a second tuning coil having a first leg and a second leg coupled together by a loop wherein the first and second legs are coupled to the circuit board alongside a second trace,
   wherein the loop of the first tuning coil extends partially over an inductor coupling that couples the first and second trace together at one end and wherein the loop of the second tuning coil extends partially over the inductor coupling.

19. An apparatus according to claim 18 wherein the loop of the second tuning coil extends partially over the loop of the first tuning coil.

20. An apparatus according to claim 19 wherein a gap separates the loop of the first tuning coil and the loop o the second tuning coil.

21. An apparatus according to claim 19 wherein the loop of the first tuning coil is located a distance form the circuit board ranging from about 0.02 to about 0.30 inches.

22. An apparatus according to claim 20 wherein the gap between the loop of the first tuning coil and the loop of the second tuning coil ranges from about 0.02 to about 0.30 inches.

23. An apparatus according to claim 20 wherein the loop of the first tuning coil is located a distance from the circuit board ranging from about 0.02 to about 0.30 inches and the gap between the loop of the first tuning coil and the loop of the second tuning coil ranges from about 0.02 to about 0.30 inches.

24. An apparatus according to claim 19 wherein the combination of the loops of the first and second tuning coils encircles the inductor coupling.

25. An apparatus according to claim 18 further comprising:
   a first port located at the second end of the first trace; and
   a second port located at the second end of the second trace.

26. An apparatus according to claim 18 wherein the first and second tuning coils are made of copper wire.

27. An apparatus according to claim 18 wherein he first and second tuning coils are 24 AWG gauge wire.

28. An apparatus according to claim 18 wherein the loops of the first and second tuning coils have a diameter of about 0.25 inches.

29. An apparatus according to claim 18 wherein the first and second tuning coils have a length of about 1.125 inches.

30. An apparatus according to claim 18 wherein the first and second legs of the first and second tuning coils have a length of about 0.205 inches.

31. A circuit for providing tuning on a circuit board, the circuit comprising:
   a first trace having a first end and a second end;
   a second trace having a first end and a second end;
   an inductor coupling the first trace and the second trace at their respective first ends;
   a first tuning coil having a first leg and a second leg coupled together by a loop wherein the first and second legs are coupled to the circuit board and wherein the loop of the first tuning coil extends partially over the inductor; and
   a second tuning coil having a first leg and a second leg coupled together by a loop wherein the first and second legs are coupled to the circuit board and wherein the loop of the second tuning coil extends partially over the inductor.

* * * * *

UNITED STATES PATENT AND TRADEMARK OFFICE
CERTIFICATE OF CORRECTION

Figure 1:
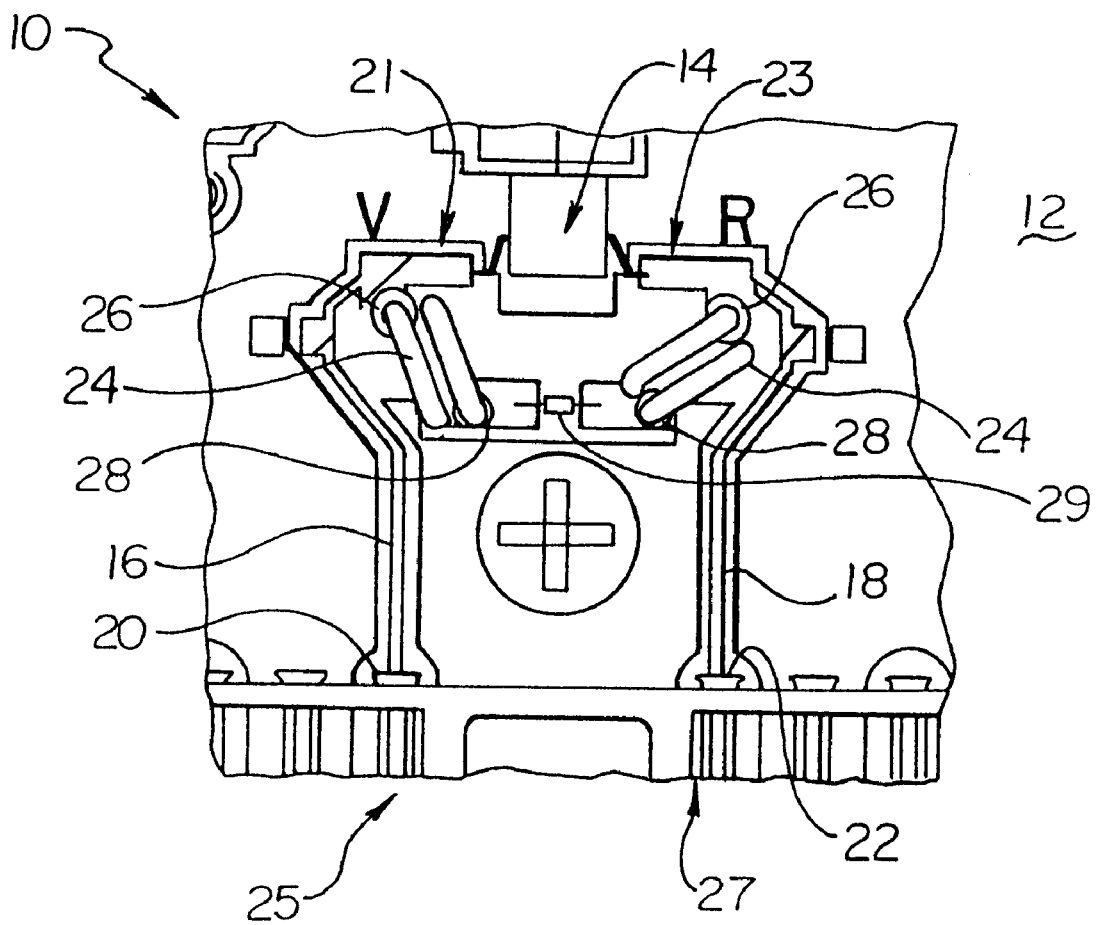
FIG. 1 is a top view of a portion of a circuit board having a tuning circuit according to the prior art.
Figure 2:
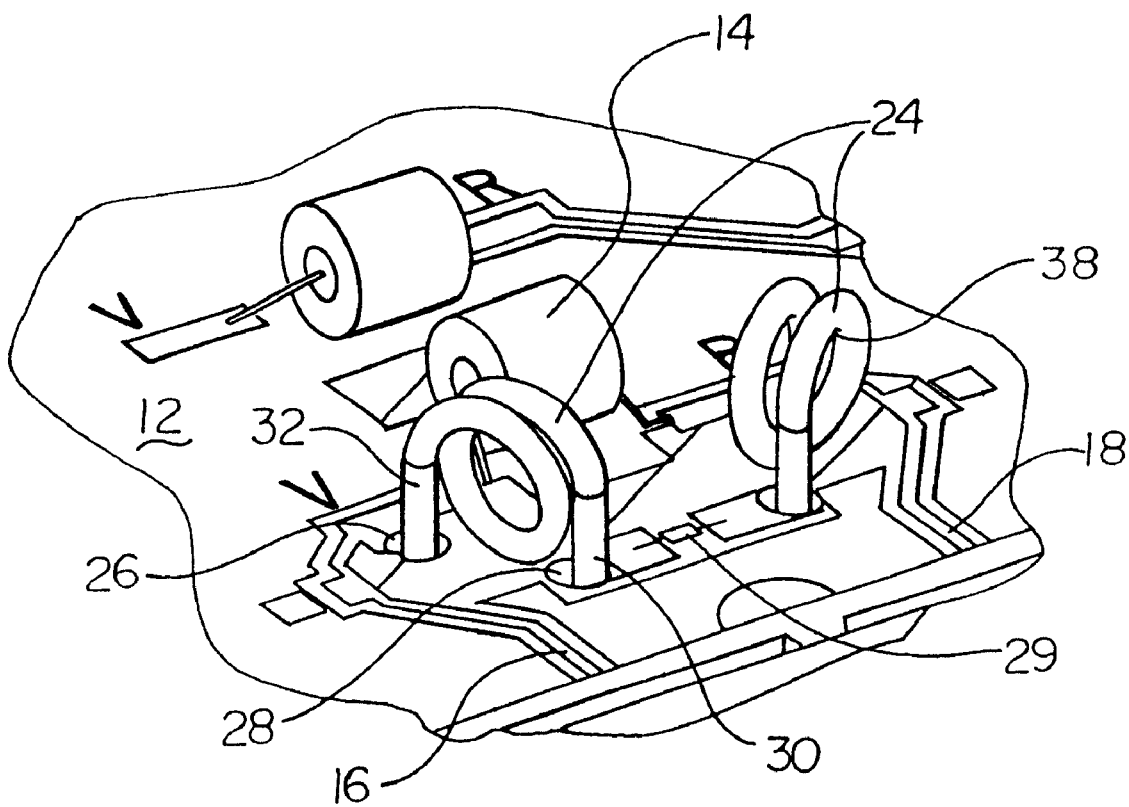
FIG. 2 is a perspective view of the prior art circuit shown in FIG. 1.
Figure 3:
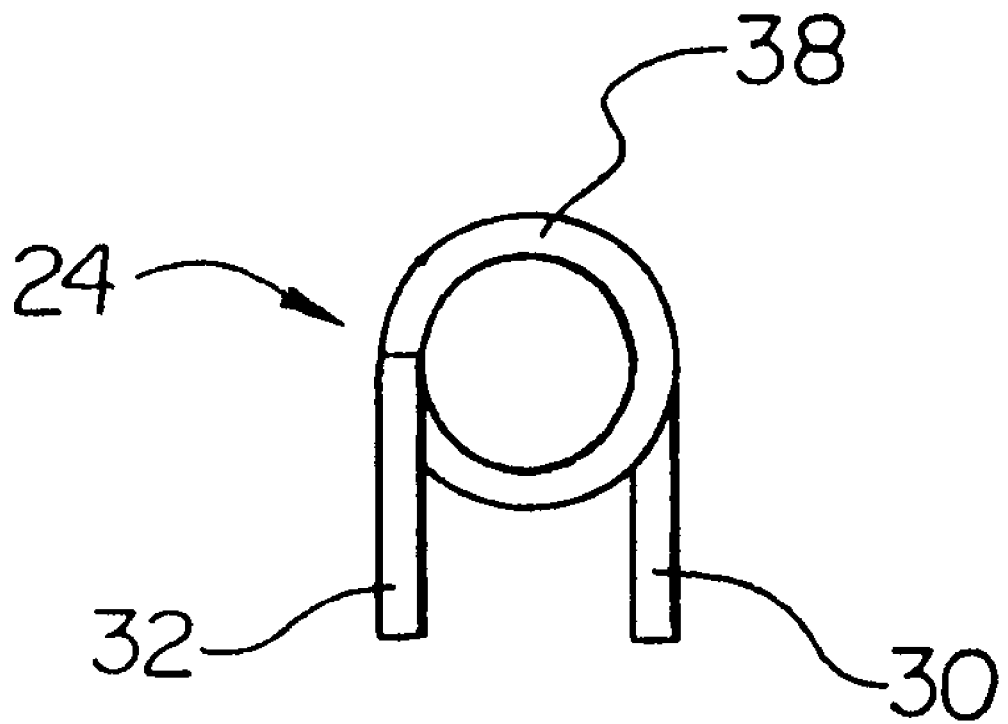
FIG. 3 is an elevational view of a tuning coil according to the prior art.
Figure 4:
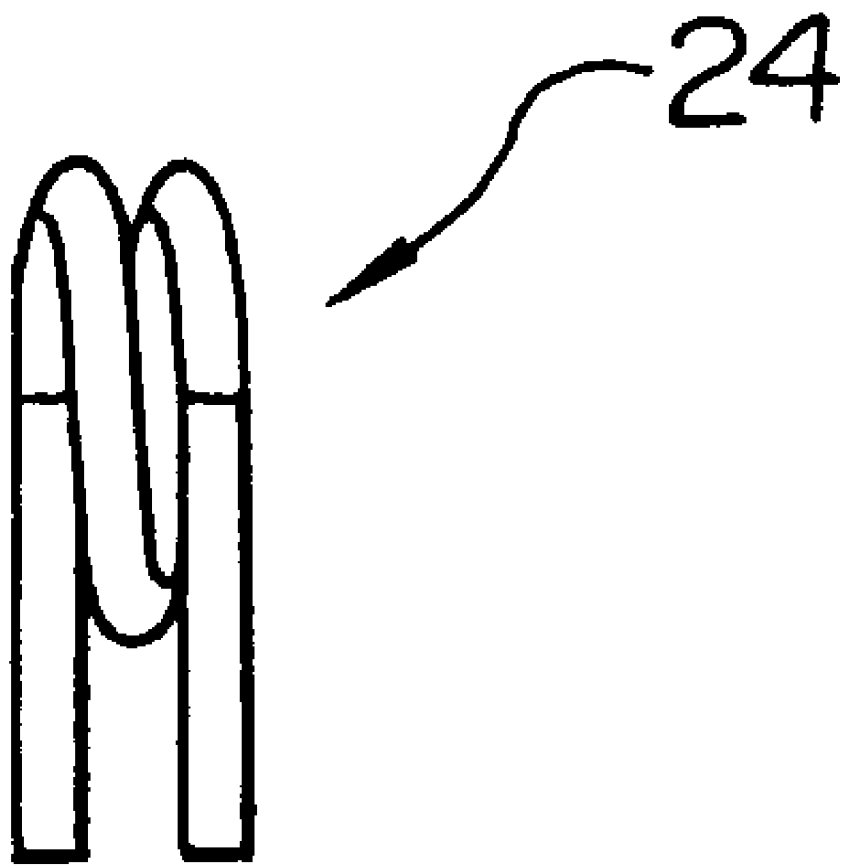
FIG. 4 is a side view of the prior art coil shown in FIG. 3.

PATENT NO. : 6,617,947 B1                                          Page 1 of 1
DATED      : September 9, 2003
INVENTOR(S) : Stansbury It is certified that error appears in the above-identified patent and that said Letters Patent is hereby corrected as shown below:

<u>Column 4,</u>
Line 15, "FIG. A" should read -- FIG. 3 --
Line 50, "distance form" should read -- distance from --

<u>Column 5,</u>
Line 49, "wherein he first" should read -- wherein the first --

<u>Column 6,</u>
Line 66, "loop o the" should read -- loop of the --

<u>Column 7,</u>
Line 2, "distance form" should read -- distance from --
Line 24, "wherein he first" should read -- wherein the first --

Signed and Sealed this

Twenty-seventh Day of January, 2004

JON W. DUDAS
*Acting Director of the United States Patent and Trademark Office*